(12) United States Patent
Lai et al.

(10) Patent No.: US 7,978,773 B2
(45) Date of Patent: Jul. 12, 2011

(54) MULTI-CHANNEL RECEIVER WITH IMPROVED AGC

(75) Inventors: Yhean-Sen Lai, Warren, NJ (US); Jie Song, Lower Macungie Township, Lehigh County, PA (US); Zhenyu Wang, Bethlehem, PA (US); Jinguo Yu, Flemington, NJ (US)

(73) Assignee: Agere Systems Inc., Allentown, PA (US)

( * ) Notice: Subject to any disclaimer, the term of this patent is extended or adjusted under 35 U.S.C. 154(b) by 1114 days.

(21) Appl. No.: 11/648,702

(22) Filed: Dec. 29, 2006

(65) Prior Publication Data

US 2008/0159446 A1  Jul. 3, 2008

(51) Int. Cl.
 *H04K 27/00* (2006.01)
(52) U.S. Cl. ........ 375/260; 375/345; 375/350; 375/318; 375/340; 455/240.1
(58) Field of Classification Search .......... 375/260, 375/345, 350, 318, 340; 455/240.1
 See application file for complete search history.

(56) References Cited

U.S. PATENT DOCUMENTS

| | | | | |
|---|---|---|---|---|
| 4,066,992 A | * | 1/1978 | Buller et al. | 367/36 |
| 5,345,439 A | | 9/1994 | Marston | 370/18 |
| 5,351,016 A | * | 9/1994 | Dent | 332/103 |
| 5,557,337 A | * | 9/1996 | Scarpa | 348/558 |
| 5,563,916 A | | 10/1996 | Scarpa | 375/345 |
| 5,694,417 A | * | 12/1997 | Andren et al. | 375/150 |
| 5,721,757 A | | 2/1998 | Banh et al. | |
| 5,732,342 A | | 3/1998 | Roth et al. | 455/234.1 |
| 5,825,807 A | | 10/1998 | Kumar | 375/200 |
| 5,838,728 A | | 11/1998 | Alamouti et al. | 375/265 |
| 5,946,292 A | | 8/1999 | Tsujishita et al. | 370/204 |
| 5,950,112 A | | 9/1999 | Hori et al. | 725/148 |
| 6,069,530 A | * | 5/2000 | Clark | 330/149 |

(Continued)

FOREIGN PATENT DOCUMENTS

JP 10271088 A 10/1998

OTHER PUBLICATIONS

U.S. Appl. No. 11/204,631, filed Aug. 16, 2005.

(Continued)

*Primary Examiner* — Chieh M Fan
*Assistant Examiner* — Santiago Garcia
(74) *Attorney, Agent, or Firm* — Mendelsohn, Drucker & Associates, P.C.; Craig M. Brown; Steve Mendelsohn

(57) ABSTRACT

An improved multi-channel receiver for satellite broadcast applications or the like. In an exemplary embodiment, a primary AGC loop controls an analog sub-receiver adapted to simultaneously receive multiple signals. Multiple digital demodulators, coupled to the sub-receiver, demodulate the multiple received signals. Multiple secondary AGC loops, one for each received signal, compensate for variations in demodulated signal strengths caused by the primary AGC loop. A feed-forward AGC compensation technique generates scalar control values for scaling the demodulated signals before the demodulated signals are processed by the secondary AGC loops. This at least partially compensates for gain variations caused by the primary AGC, reducing received signal drop-outs before the secondary AGC loops can compensate for the gain variations. Because of systemic delays in the sub-receiver and the demodulators, the scalar control values are independently timed to be coincident with the variations in the demodulated signal strengths caused by the primary AGC loop.

18 Claims, 1 Drawing Sheet

U.S. PATENT DOCUMENTS

| | | | | |
|---|---|---|---|---|
| 6,094,162 | A | 7/2000 | Sullivan | 342/357.01 |
| 6,122,331 | A | 9/2000 | Dumas | 375/345 |
| 6,144,513 | A * | 11/2000 | Reed et al. | 360/51 |
| 6,310,513 | B1 | 10/2001 | Iemura | 329/304 |
| 6,317,456 | B1 | 11/2001 | Sayeed | 375/227 |
| 6,317,470 | B1 | 11/2001 | Kroeger et al. | 375/340 |
| 6,353,463 | B1 | 3/2002 | Seo | |
| 6,359,506 | B1 * | 3/2002 | Camp et al. | 330/124 R |
| 6,377,316 | B1 * | 4/2002 | Mycynek et al. | 348/731 |
| 6,389,000 | B1 * | 5/2002 | Jou | 370/342 |
| 6,473,467 | B1 * | 10/2002 | Wallace et al. | 375/267 |
| 6,542,203 | B1 * | 4/2003 | Shadwell et al. | 348/726 |
| 6,586,996 | B2 * | 7/2003 | Fanous et al. | 330/254 |
| 6,598,200 | B1 | 7/2003 | Greenwood et al. | 714/774 |
| 6,618,367 | B1 * | 9/2003 | Riazi et al. | 370/347 |
| 6,628,724 | B2 | 9/2003 | Bannasch et al. | 375/259 |
| 6,643,498 | B1 | 11/2003 | Miyajima | 455/230 |
| 6,657,491 | B2 * | 12/2003 | Fanous et al. | 330/124 R |
| 6,670,848 | B2 * | 12/2003 | Fanous et al. | 330/124 R |
| 6,757,334 | B1 * | 6/2004 | Feher | 375/259 |
| 6,771,719 | B1 * | 8/2004 | Koyama et al. | 375/345 |
| 6,798,791 | B1 * | 9/2004 | Riazi et al. | 370/515 |
| 6,801,085 | B2 * | 10/2004 | Fanous et al. | 330/124 R |
| 6,838,937 | B2 * | 1/2005 | Fanous et al. | 330/124 R |
| 6,885,852 | B2 * | 4/2005 | Hughes et al. | 455/234.1 |
| 6,920,311 | B2 * | 7/2005 | Rofougaran et al. | 455/66.1 |
| 6,924,711 | B2 * | 8/2005 | Liu | 332/159 |
| 6,943,623 | B2 * | 9/2005 | Trevelyan | 330/100 |
| 6,992,855 | B2 * | 1/2006 | Ehrlich | 360/77.08 |
| 7,002,638 | B2 | 2/2006 | Yeo et al. | 348/729 |
| 7,020,218 | B2 * | 3/2006 | Arnesen | 375/316 |
| 7,050,419 | B2 * | 5/2006 | Azenkot et al. | 370/347 |
| 7,058,002 | B1 | 6/2006 | Kumagai et al. | 370/203 |
| 7,062,243 | B2 | 6/2006 | Simmons et al. | 455/234.1 |
| 7,065,165 | B2 | 6/2006 | Heinonen et al. | 375/345 |
| 7,079,584 | B2 * | 7/2006 | Feher | 375/260 |
| 7,099,688 | B2 | 8/2006 | Wilson | 455/552.1 |
| 7,106,232 | B2 | 9/2006 | Harberts et al. | 341/139 |
| 7,110,434 | B2 | 9/2006 | Currivan et al. | 375/144 |
| 7,110,735 | B2 | 9/2006 | Abe | 455/234.1 |
| 7,123,664 | B2 * | 10/2006 | Matero | 375/295 |
| 7,123,892 | B2 | 10/2006 | Li et al. | 455/142 |
| 7,136,622 | B2 | 11/2006 | Rofougaran et al. | 455/20 |
| 7,142,665 | B2 | 11/2006 | Barron et al. | 379/406.08 |
| 7,149,263 | B2 | 12/2006 | Higure | 375/345 |
| 7,174,165 | B2 * | 2/2007 | Lee | 455/422.1 |
| 7,190,683 | B2 * | 3/2007 | Giallorenzi et al. | 370/335 |
| 7,209,717 | B2 * | 4/2007 | Okada et al. | 455/126 |
| 7,236,542 | B2 * | 6/2007 | Matero | 375/295 |
| 7,274,748 | B1 * | 9/2007 | Khlat | 375/296 |
| 7,359,690 | B2 * | 4/2008 | Lai | 455/240.1 |
| 7,373,126 | B2 | 5/2008 | Narita | |
| 7,386,285 | B2 * | 6/2008 | Yamauchi | 455/136 |
| 7,415,259 | B2 * | 8/2008 | Fishman et al. | 455/250.1 |
| 7,428,022 | B2 * | 9/2008 | Teichner et al. | 348/725 |
| 7,447,272 | B2 * | 11/2008 | Haglan | 375/295 |
| 7,460,832 | B2 * | 12/2008 | Lee et al. | 455/63.1 |
| 7,496,163 | B2 * | 2/2009 | Terao | 375/345 |
| 7,515,891 | B2 | 4/2009 | Darabi | 455/250.1 |
| 7,529,523 | B1 * | 5/2009 | Young et al. | 455/115.1 |
| 7,539,469 | B2 | 5/2009 | Zahm et al. | |
| 7,545,880 | B1 * | 6/2009 | Coons et al. | 375/296 |
| 7,551,686 | B1 * | 6/2009 | Coons et al. | 375/296 |
| 7,551,736 | B2 * | 6/2009 | Lee et al. | 380/42 |
| 7,579,912 | B2 * | 8/2009 | Fanous et al. | 330/254 |
| 7,583,746 | B2 | 9/2009 | Aoki et al. | |
| 7,586,999 | B2 | 9/2009 | Lee | 375/316 |
| 2002/0057750 | A1 | 5/2002 | Nakao et al. | 375/345 |
| 2002/0163879 | A1 | 11/2002 | Li et al. | 370/200 |
| 2003/0032402 | A1 * | 2/2003 | Asano | 455/234.1 |
| 2003/0035070 | A1 * | 2/2003 | Fanous et al. | 348/707 |
| 2003/0227342 | A1 * | 12/2003 | Liu | 332/145 |
| 2004/0161026 | A1 * | 8/2004 | Jensen et al. | 375/224 |
| 2004/0214529 | A1 * | 10/2004 | Terao | 455/78 |
| 2004/0218576 | A1 * | 11/2004 | Imagawa et al. | 370/342 |
| 2005/0096004 | A1 * | 5/2005 | Tso et al. | 455/334 |
| 2005/0128362 | A1 * | 6/2005 | Teichner et al. | 348/725 |
| 2005/0231783 | A1 * | 10/2005 | Panzeri | 359/237 |
| 2006/0034400 | A1 * | 2/2006 | Yang et al. | 375/345 |
| 2006/0050817 | A1 * | 3/2006 | Kanemoto et al. | 375/347 |
| 2006/0077080 | A1 * | 4/2006 | Yamauchi | 341/114 |
| 2006/0264191 | A1 * | 11/2006 | Lai | 455/127.2 |
| 2007/0014382 | A1 * | 1/2007 | Shakeshaft et al. | 375/297 |
| 2007/0033624 | A1 * | 2/2007 | Oh | 725/100 |
| 2007/0041481 | A1 * | 2/2007 | Malkemes et al. | 375/345 |
| 2007/0054642 | A1 | 3/2007 | Bhardwaj et al. | 455/234.1 |
| 2007/0076783 | A1 * | 4/2007 | Dishman et al. | 375/136 |
| 2007/0089148 | A1 * | 4/2007 | Oh et al. | 725/90 |
| 2007/0207743 | A1 * | 9/2007 | Rofougaran et al. | 455/73 |
| 2008/0070534 | A1 * | 3/2008 | Lai | 455/232.1 |
| 2008/0139110 | A1 * | 6/2008 | Lai et al. | 455/3.02 |
| 2008/0159446 | A1 * | 7/2008 | Lai et al. | 375/345 |
| 2008/0205541 | A1 * | 8/2008 | Rofougaran | 375/269 |
| 2008/0212656 | A1 * | 9/2008 | Feher | 375/150 |
| 2008/0267326 | A1 * | 10/2008 | Lai et al. | 375/345 |
| 2008/0268798 | A1 * | 10/2008 | Lai et al. | 455/127.2 |
| 2008/0311845 | A1 * | 12/2008 | Scarpa et al. | 455/3.02 |
| 2009/0068968 | A1 | 3/2009 | Rofougaran | |
| 2009/0110047 | A1 * | 4/2009 | Lai et al. | 375/232 |
| 2009/0168809 | A1 * | 7/2009 | Scarpa et al. | 370/503 |
| 2009/0170424 | A1 * | 7/2009 | Malkemes et al. | 455/3.02 |
| 2009/0202019 | A1 * | 8/2009 | Rofougaran | 375/298 |
| 2009/0225907 | A1 * | 9/2009 | Shoarinejad et al. | 375/340 |
| 2009/0238251 | A1 * | 9/2009 | Rofougaran | 375/219 |

OTHER PUBLICATIONS

U.S. Appl. No. 11/522,689, filed Sep. 18, 2006.
U.S. Appl. No. 11/608,449, filed Dec. 8, 2006.

* cited by examiner

MULTI-CHANNEL RECEIVER WITH IMPROVED AGC

TECHNICAL FIELD

The present invention relates to digital data receivers, and, in particular, to multi-channel data receivers for use in satellite broadcast systems or the like.

BACKGROUND

A typical satellite digital audio radio service (SDARS) system, such as that provided by XM Satellite Radio Inc. of Washington, D.C. or Sirius Satellite Radio Inc. of New York City, N.Y., uses two or more satellites with orbits that provide a usable signal over most of North America at all times. However, the signals from the satellites tend not to be received well in cities or anywhere a satellite receiver does not have an unobstructed view of at least one of the satellites. Thus, in cities and other areas where direct reception from a satellite is impossible or unlikely, the SDARS provider may have installed terrestrial repeaters that provide a digital audio data signal carrying the same digital audio data that the satellites are broadcasting. The use of redundant digital audio data channels minimizes service outages as the satellites orbit the earth or as a user moves about. To minimize interference and provide redundancy, the terrestrial repeater and each satellite transmits its digital audio data signal on a different channel, each channel having a different carrier frequency. Moreover, the modulation method used for the terrestrial channel (e.g., a carrier-orthogonal frequency division multiplexed (COFDM) modulation technique) is chosen for its resistance to fading caused by multipath interference and is more complicated than the modulation method used for the satellite channels (e.g., a time division multiplexed (TDM) modulation technique).

A typical prior art SDARS receiver has multiple independent analog sub-receivers therein, one sub-receiver for each channel, and circuitry within the receiver selects which sub-receiver provides the best data signal for decoding. The radio frequency (RF) and intermediate frequency (IF) portions of the sub-receivers are analog, and each sub-receiver contains an analog-to-digital converter (ADC) that digitizes IF signals for further processing by various digital circuits. Because each analog sub-receiver consumes considerable power, an SDARS receiver having three or more sub-receivers operating simultaneously does not lend itself to portable or other low-power applications. In addition, having three or more separate sub-receivers makes the SDARS receiver physically larger than desired for certain applications.

SUMMARY

In one embodiment, the present invention is a receiver comprising a gain section, a detector, a demodulator, a scalar, and a controller. The gain section generates, based on a gain control value, an output signal from one or more received signals. The detector generates an intensity value in response to the output signal. The demodulator, for each received signal, demodulates the output signal into a corresponding demodulated signal having an amplitude. The scalar, for each demodulated signal, scales the amplitude of the corresponding demodulated signal based on a corresponding scalar control value. The controller generates and adaptively changes the gain control value and each scalar control value based on changes in the intensity value. Further, the controller delays a change of at least one of the scalar control values based on at least one processing delay associated with generating the corresponding demodulated signal.

In still another embodiment, the present invention includes the steps of: generating, based on a gain control value, an output signal from the one or more received signals; generating an intensity value in response to the output signal; demodulating, for each received signal, the output signal into a corresponding demodulated signal having an amplitude; scaling, for each demodulated signal, the amplitude of the corresponding demodulated signal based on a corresponding scalar control value; and generating and adaptively updating the gain control value and each scalar control value based on changes in the intensity value. A change of at least one scalar control value is delayed based on at least one processing delay associated with generating the corresponding demodulated signal.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Signals and corresponding nodes, ports, inputs, or outputs may be referred to by the same name and are interchangeable for purposes here.

Figure 1:
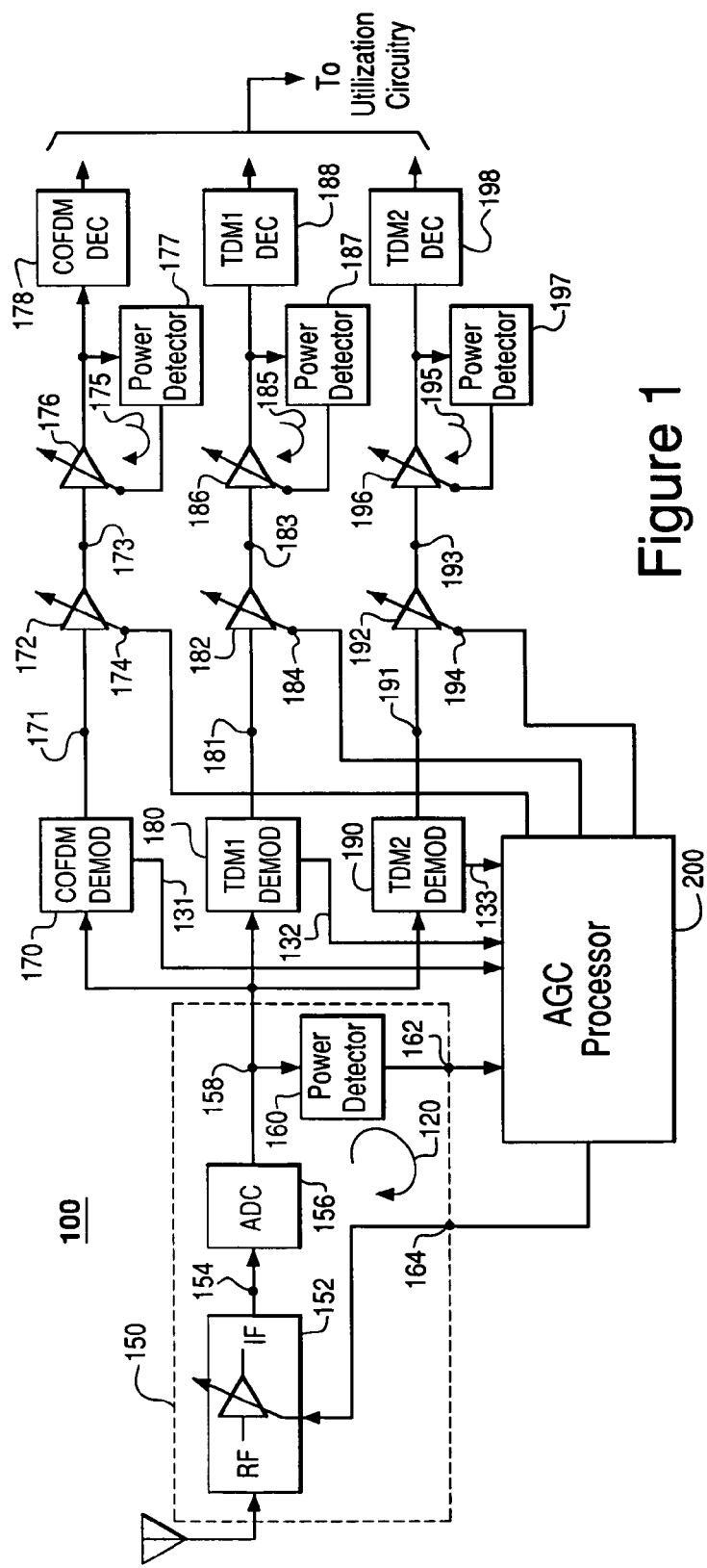
FIG. 1 is a simplified block diagram of a portion of an improved SDARS receiver with one analog sub-receiver, one primary and three secondary AGC loops, and a feed-forward AGC compensation technique according to the one exemplary embodiment of the present invention.

Referring to FIG. 1, an exemplary embodiment of the invention is shown, in which a simplified block diagram of an SDARS receiver 100 having one sub-receiver 150 capable of simultaneously receiving a plurality of channels (RF signals) is diagrammed. The sub-receiver 150 comprises an analog RF/IF section 152 producing an amplified analog IF output signal at node 154, the analog output signal having therein a combination of one or more IF signals based on the received signals, each IF signal with a different IF carrier frequency. The analog output signal is digitized by an analog-to-digital converter (ADC) 156 to produce a digitized output signal at node 158. Included in the sub-receiver is a power detector 160, preferably a root-mean-square (RMS) power detector, generating an intensity value at node 162. It is understood that the power detector 160 may be of another design, such as a peak detector. While shown as responsive to the digitized output signal on node 158, the detector 160 may instead receive the analog output signal on node 154 for generating the intensity value. Moreover, as is known in the art, the RF/IF section 152 may be a direct conversion sub-receiver, avoiding the need for an IF portion by amplifying and directly converting received RF signals to a base-band analog output signal at node 154. Thus, the section 152 may be referred to generically as a gain section.

The RF/IF section 152 is responsive to an AGC control value on node 164 to vary the gain of the RF/IF section 152. As is appreciated by those skilled in the art, the gain in the RF/IF section 152 is adjusted in response to the AGC control value so that the RF/IF section 152 has the proper amount of gain to produce an analog IF output signal on node 154 that has an average amplitude near the middle of the dynamic range of ADC 156. This avoids saturating the ADC 156 on peaks in the amplitude of the analog IF output signal on node 154 but leaves the analog signal with sufficient amplitude that the ADC 156 produces a digitized output signal (containing the one or more IF signals in digitized form) at node 158 having low distortion and a good signal-to-noise ratio. As will be discussed in more detail below, the AGC control value is produced by AGC processor 200 in response to the intensity value from detector 160, thereby forming a primary AGC loop 120 for the sub-receiver 150. Generally, the AGC processor 200, in response to a change in the intensity value, changes the AGC control value to partially counteract the change in the amplitude of the digitized output signal on node 158. For example, when a change in the intensity value indicates an increase in the power (thus, the amplitude) of the digitized output signal on node 158, the AGC processor 200 changes the AGC control value in response to reduce the gain of the RF/IF section 152 and lessen the increase in the amplitude of the digitized output signal. Conversely, when a change in the intensity value indicates a decrease in the power (thus, the amplitude) of the digitized output signal on node 158, the AGC processor 200 changes the AGC control value in response to increase the gain of the RF/IF section 152. However, because the primary AGC loop 120 has a finite delay and a finite loop gain (and, as will be discussed in more detail below, because the AGC control value changes in discrete steps), the primary AGC loop 120 cannot completely counteract an amplitude change in digitized output signal. Moreover, a change in the AGC control value by the primary AGC loop 120 will appear as a corresponding change in the amplitude of at least one of the one or more IF signals in the analog IF output signal on node 154 and, thus, a change in the amplitude of the corresponding one or more digitized IF signals in the digitized output signal on node 158.

Coupled to the output node 158 are, in this example, three demodulators 170, 180, and 190. The demodulator 170, in this example a digital down-converter for a COFDM-modulated signal, demodulates one channel (IF signal) in the digitized output signal on node 158 to produce a demodulated signal on node 171. Similarly, demodulators 180 and 190, in this example digital down-converters for TDM-modulated signals, produce demodulated signals on respective nodes 181 and 191. It is understood that if a single RF signal is being received by the sub-receiver 150, then instead of all three demodulators operating and consuming power, just the demodulator for that received signal is used and the other demodulators and associated circuitry (such as the corresponding secondary AGC loops) are disabled. Similarly, if two signals are being simultaneously received, then the two demodulators for those signals are used and the remaining demodulator and associated circuitry are disabled.

The demodulated signals on nodes 171, 181, and 191 are scaled (i.e., amplified or attenuated) by corresponding scalars 172, 182, and 192 to produce corresponding scaled demodulated signals at nodes 173, 183, and 193, respectively, the amount of scaling being determined by corresponding scalar control values on nodes 174, 184, and 194 from the AGC processor 200. While the scalars 172, 182, and 192 are shown as variable gain amplifiers, they may be multipliers or other circuits or algorithms designed to controllably increase or decrease the amplitude of the demodulated signals at nodes 171, 181, and 191. As will be discussed in greater detail below, the AGC processor 200 generates the scalar control values, in addition to the AGC control value, in response to the intensity value from detector 160. The AGC processor responds to a change in the intensity value from detector 160 by generating corresponding changes in the AGC and scalar control values. Preferably, the amount of change in the gain of the RF/IF section 152 in response to the change in the AGC control value from the AGC processor is at least partially offset by a corresponding, but opposite, change in the scaling of the demodulated signals by the scalars 172, 182, and 192. Thus, the change in the scalar control values by AGC processor 200 is a feed-forward AGC technique to at least partially compensate for the effect the primary AGC loop has on the received signals.

It is preferable that the AGC control value and scalar control values from the AGC processor 200 change in discrete steps (e.g., 3 dB, 5 dB, etc.) to reduce the frequency of changes to the AGC and scalar control values. Moreover, as known in the art, it is desirable that the AGC processor 200 implement a level of hysteresis in the generation of the AGC and scalar control values to further reduce the frequency of changes thereto and enhance stability within the primary AGC loop 120.

Coupled to each of the nodes 173, 183, and 193 are secondary AGC loops 175, 185, and 195 comprising corresponding scalars 176, 186, and 196, and corresponding power detectors 177, 187, and 197. As is well understood in the art, the secondary AGC loops 175, 185, and 195 serve to further regulate the amplitude of the corresponding scaled demodulated signals on nodes 173, 183, and 193 for further processing by corresponding decoders 178, 188, and 198. However, the secondary AGC loops 175, 185, and 195 take a finite amount of time to equalize an amplitude change, during which time the output signals therefrom may be too low ("drop-out") for one or more of the decoders 178, 188, and 198 to process correctly.

As is known in the art, a digital demodulator takes time to demodulate a signal, the amount of time being dependent on the complexity of the demodulator. In this embodiment, a change in the amplitude of the digitized signal on node 158 propagates through the demodulators 170, 180, and 190, resulting in an amplitude change in at least one of the demodulated signals appearing on respective output nodes 171, 181, and 191 after the delay from the respective demodulator. Because COFDM modulation is more complex than TDM modulation, the demodulator 170 is typically more complicated and has a longer latency than demodulators 180 and 190, both having substantially the same latency. Moreover, it is understood that some demodulator designs are adaptive and the amount of latency in an adaptive demodulator may vary depending on the amount of processing needed to demodulate a signal. Thus, it may be necessary to keep track of the latency of each demodulator, the importance of which is discussed in more detail below.

As stated above, there is a delay between a change in the AGC control value and a change in the amplitude of the digitized output signal at node 158. This delay is in addition to the demodulator latency. Taken together, the delay between a change in the AGC control value to the RF/IF portion 152 and when that change results in a change in amplitude of a demodulated signal might be considerable and will vary based upon the latency of the demodulator being used. In particular, the delay from a change in the AGC control value to a corresponding change in the amplitude of the demodulated signal on node 173 may be tens of milliseconds longer than the delay of the corresponding change in the amplitude of the demodulated signal on node 183 or 193. Since the changes in the scalar control values at least partially compensate for the amplitude changes in the corresponding demodulated signals, it is therefore desirable that each scalar 172, 182, and 192 not change the amplitude of the demodulated signals until the changes in the amplitudes of the corresponding demodulated signals at the nodes 171, 181, and 191 reach the input of the respective scalar. Put another way, the changes in the scalar control values should substantially coincide in time with the corresponding changes in amplitudes of the demodulated signals. In this embodiment, the desired delay is accomplished by the AGC processor 200 independently delaying the change in each scalar control value to substantially coincide with the corresponding change in the amplitude of the demodulated signals at the scalars 172, 182, and 192. The temporal alignment of the changes in the scalar control values with the changes in amplitude of the demodulated signals reduces "glitching," i.e., the overshooting and undershooting of the amplitude of the scaled demodulated signals at nodes 173, 183, and 193, that the secondary AGC loops 175, 185, and 195 then process.

Figure 2:
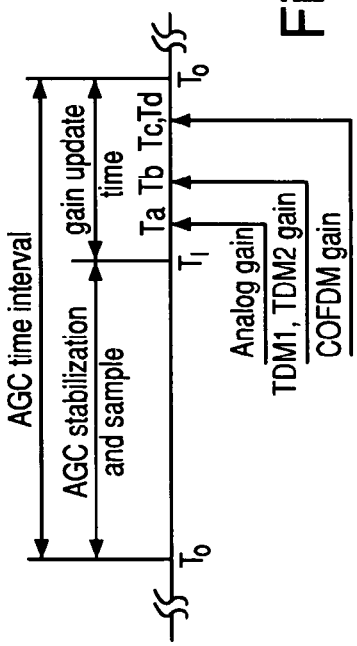
FIG. 2 is a simplified timing diagram demonstrating operation of the improved SDARS receiver in FIG. 1.

Preferably, the power detectors (160, 177, 187, and 197), demodulators (170, 180, and 190), scalars (172, 176, 182, 186, 192, and 196), decoders (178, 188, and 198) and AGC processor 200 are implemented in a digital signal processor, microprocessor, application-specific integrated circuit, or the like. In addition, it is desirable that the intensity value from detector 160 be stable before the AGC and scalar control values are calculated and applied to the RF/IF portion 152 and scalars 172, 182, and 192. As shown in FIG. 2 and for this embodiment, during a first time sub-interval $T_0$ to $T_1$ of an AGC update interval, the intensity value stabilizes and is sampled at time $T_0$. Then the AGC and the scalar control values are calculated by the AGC processor 200. During the time interval from $T_1$ to $T_0$ of the subsequent AGC update interval, the AGC control value is applied to the RF/IF portion 152 at time $T_a$, the scalar control value for scalars 182 and 192 then applied at time $T_b$ (both demodulators 180 and 190 having the same latency in this example), and then the scalar control value for scalar 172 is applied at interval $T_c$ (the latency of demodulator 170 being longer than the latency of the demodulators 180 and 190). It is understood that the time $T_b$ may be different for the demodulators 180 and 190 if the demodulators have different latencies.

As mentioned above, the latency of the demodulators 170, 180, and 190 may vary over time. In this embodiment and as is well known in the art, the demodulators 170, 180, and 190 are each of a conventional design and configurable. The configurability of the demodulators allows each demodulator to independently apply an amount of signal processing to the digitized signal on node 158 depending on a desired level of quality (e.g., error rate, signal-to-noise ratio, etc.) in each demodulator's output signal. Generally, the more signal processing that is done by a demodulator, the more latency the demodulator has. In this embodiment, the AGC processor 200 keeps track of the latency of the demodulators 170, 180, and 190 by reading associated registers (not shown) that contain data indicative of the corresponding demodulator's latencies via exemplary data paths 131-133. The AGC processor 200 then uses the data to calculate the times $T_b$ and $T_c$. It is understood, however, that one or more of the demodulators 170, 180, and 190 may have a fixed latency, obviating the need for the associated data path 131-133 so long as the AGC processor 200 has the pertinent latency data stored therein.

Operation of the receiver 100 is illustrated by the following example where steady COFDM and TDM signals (TDM1 and TDM2) are simultaneously received by the sub-receiver 150 and where the COFDM signal has the best signal-to-noise ratio but not the strongest signal. Because the COFDM and TDM signals are being simultaneously received, the digitized output signal on node 158 contains both the COFDM and the TDM1 and TDM2 signals added together but with different carrier frequencies. If the received COFDM, TDM1, and TDM2 signals are steady, then the intensity value at node 162 is steady and the AGC processor 200 supplies a certain steady AGC control value to the RF/IF section 152 and certain steady scalar control values to the scalars 172, 182, and 192. Should just the TDM1 signal suddenly increase in strength, the amplitude of the digitized output signal at node 158 increases (from the increased strength of the TDM1 signal, the COFDM and TDM2 signal strengths remaining unchanged), resulting in an increase in the intensity value at node 162. If the intensity value increase is sufficient to overcome any hysteresis by the AGC processor 200, then the AGC processor 200 changes (steps) the AGC control value to the RF/IF section 152 to reduce the gain of the RF/IF section 152. The change in the AGC control value reduces (attenuates) the amplitude of the digitized output signal at node 158, and, thus, the amplitudes of the COFDM, TDM1, and TDM2 signals in the digitized output signal are decreased equally. Further, the demodulated COFDM, TDM1, and TDM2 signals on nodes 171, 181, and 191, respectively, are also decreased equally. Because the signal strength of the COFDM signal has not changed and the gain of the RF/IF section has been reduced, the amplitude of the demodulated COFDM signal on node 171 (and that of demodulated TDM2 signal on node 191)) is reduced by approximately the amount the gain of the RF/IF section 152 was reduced in response to the change in AGC control value. However, after primary AGC loop 120 stabilized, the amplitude of the demodulated TDM1 signal on node 181 is changed a lesser amount when compared to the amplitude of the demodulated TDM1 signal before the received TDM1 signal increased in strength.

For this example and notwithstanding the smaller amplitude, the COFDM signal remains the better signal for utilization by the receiver 100 because it has a better signal-to-noise ratio than the TDM signals. However, if the amplitude of the demodulated COFDM signal is too low, then the COFDM decoder 178 might not correctly process the attenuated COFDM signal, degrading the performance of the receiver 100, until the secondary AGC loop 175 catches up to compensate for the low-amplitude demodulated COFDM signal. Thus, the primary AGC loop 120 degrades the performance of the receiver 100 in this instance because the increase in TDM1 signal strength "dominates" the sub-receiver 150 to the detriment of the COFDM signal and the rest of the receiver 100.

To overcome the undesired attenuation of the COFDM signal by the action of the primary AGC loop 120, the AGC processor 200 changes the scalar control values to at least partially compensate for the change in gain in the RF/IF section 152. Since, in this embodiment, the AGC processor 200 does not know which signal, COFDM or TDM, has increased in strength, the processor 200, after the appropriate delays, increases the scalar control values to all the scalars 172, 182, and 192 to scale up (i.e., amplify) the demodulated signals on nodes 171, 181, and 191 such that the amplitude of the scaled demodulated COFDM signal on node 173 (and, correspondingly, the scaled demodulated TDM2 signal on node 193) is about what it was before the received TDM1 signal increased in strength. Specifically and for this example, if the gain of the RF/IF section 152 is reduced by 6 dB in response to a change in the AGC control value, then the scalar control values to scalars 172, 182, and 192 are increased by a factor of 2. Any small variation in amplitude of the scaled demodulated COFDM signal at node 173 is further reduced by the secondary AGC loop 175. The delays in the changes to the scalar control values by the AGC controller 200 substantially time-aligns the scalar control value changes with the amplitude changes in the demodulated COFDM, TDM1, and TDM2 signals after having passed through the respective demodulators 170, 180, and 190. Advantageously, the time alignment of the increase in the scalar control value to scalar 172 keeps the amplitude of the COFDM signal from not being too low for a length of time sufficient to cause the COFDM decoder 170 to incorrectly decode the demodulated COFDM signal from the scalar 176. Although the amplitude of the scaled demodulated TDM1 signal might be greater than desired, the secondary AGC loop 185 reduces the amplitude to a desired value.

Although the present invention has been described in the context of an SDARS receiver, those skilled in the art will understand that the present invention can be implemented in the context of other types of multi-channel receivers, such as and without limitation, diversity receivers.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A receiver comprising:
   a gain section adapted to generate, based on a gain control value, an output signal from one or more received signals;
   a detector adapted to generate an intensity value in response to the output signal;
   a demodulator, for each received signal, adapted to demodulate the output signal into a corresponding demodulated signal having an amplitude;
   a scalar, for each demodulated signal, adapted to scale the amplitude of the corresponding demodulated signal based on a corresponding scalar control value; and
   a controller adapted to generate and adaptively change the gain control value and each scalar control value based on changes in the intensity value, wherein the controller is further adapted to delay a change of at least one of the scalar control values based on at least one processing delay associated with generating the corresponding demodulated signal, wherein:
     the receiver is adapted to receive two or more received signals;
     the receiver comprises two or more demodulators and two or more scalars corresponding to the two or more received signals;
     the controller is adapted to delay the change of each scalar control value based on the at least one processing delay associated with the generation of the corresponding demodulated signal; and
     the controller is adapted to delay the change of each scalar control value to coincide in time with a change in the corresponding demodulated signal resulting from an earlier change in the intensity value.

2. The receiver of claim 1, wherein the controller, responsive to the two or more demodulators, is adapted to independently delay the change of each scalar control value in accordance with any differences in the processing delays by the demodulators.

3. A receiver comprising:
   a gain section adapted to generate, based on a gain control value, an output signal from one or more received signals;
   a detector adapted to generate an intensity value in response to the output signal;
   a demodulator, for each received signal, adapted to demodulate the output signal into a corresponding demodulated signal having an amplitude;
   a scalar, for each demodulated signal, adapted to scale the amplitude of the corresponding demodulated signal based on a corresponding scalar control value; and
   a controller adapted to generate and adaptively change the gain control value and each scalar control value based on changes in the intensity value, wherein the controller is further adapted to delay a change of at least one of the scalar control values based on at least one processing delay associated with generating the corresponding demodulated signal, wherein:
     the receiver is adapted to process three received signals comprising a COFDM signal and two TDM signals; and
     the receiver comprises a COFDM demodulator, two TDM demodulators, and three scalars corresponding to the three received signals.

4. A receiver comprising:
   a gain section adapted to generate, based on a gain control value, an output signal from one or more received signals;
   a detector adapted to generate an intensity value in response to the output signal;
   a demodulator, for each received signal, adapted to demodulate the output signal into a corresponding demodulated signal having an amplitude;

a scalar, for each demodulated signal, adapted to scale the amplitude of the corresponding demodulated signal based on a corresponding scalar control value; and a controller adapted to generate and adaptively change the gain control value and each scalar control value based on changes in the intensity value, wherein the controller is further adapted to delay a change of at least one of the scalar control values based on at least one processing delay associated with generating the corresponding demodulated signal, wherein the controller is adapted to delay the change of the at least one scalar control value to coincide in time with a change in the corresponding demodulated signal resulting from an earlier detected change in the intensity value.

5. A receiver comprising:

a gain section adapted to generate, based on a gain control value, an output signal from one or more received signals;

a detector adapted to generate an intensity value in response to the output signal;

a demodulator, for each received signal, adapted to demodulate the output signal into a corresponding demodulated signal having an amplitude;

a scalar, for each demodulated signal, adapted to scale the amplitude of the corresponding demodulated signal based on a corresponding scalar control value; and a controller adapted to generate and adaptively change the gain control value and each scalar control value based on changes in the intensity value, wherein the controller is further adapted to delay a change of at least one of the scalar control values based on at least one processing delay associated with generating the corresponding demodulated signal, wherein the controller is adapted to control a change in gain of each scalar to be substantially equal and opposite to a earlier change in gain of the gain section, such that amplitude scaling by each scalar at least partially compensates for gain changes by the gain section.

6. A receiver comprising:

a gain section adapted to generate, based on a gain control value, an output signal from one or more received signals;

a detector adapted to generate an intensity value in response to the output signal;

a demodulator, for each received signal, adapted to demodulate the output signal into a corresponding demodulated signal having an amplitude;

a scalar, for each demodulated signal, adapted to scale the amplitude of the corresponding demodulated signal based on a corresponding scalar control value;

a controller adapted to generate and adaptively change the gain control value and each scalar control value based on changes in the intensity value, wherein the controller is further adapted to delay a change of at least one of the scalar control values based on at least one processing delay associated with generating the corresponding demodulated signal; and a secondary gain loop for each scaled, demodulated signal generated by the corresponding scalar.

7. The receiver of claim 6, wherein each secondary gain loop comprises:

a secondary scalar adapted to further scale the corresponding scaled, demodulated signal based on a secondary scalar control value; and a secondary detector adapted to generate the secondary scalar control value based on the output of the secondary scalar.

8. The invention of claim 6, wherein the receiver further comprises an analog-to-digital converter adapted to digitize the output signal for application to the detector and each demodulator, wherein:

the detector is a power detector;

each demodulator is a digital down-converter; and the power detector, each demodulator, each scalar, and the controller are implemented in a digital processor.

9. A method for processing one or more received signals, the method comprising:

generating, based on a gain control value, an output signal from the one or more received signals;

generating an intensity value in response to the output signal;

demodulating, for each received signal, the output signal into a corresponding demodulated signal having an amplitude;

scaling, for each demodulated signal, the amplitude of the corresponding demodulated signal based on a corresponding scalar control value; and generating and adaptively updating the gain control value and each scalar control value based on changes in the intensity value, wherein a change of at least one scalar control value is delayed based on at least one processing delay associated with generating the corresponding demodulated signal, wherein:

the output signal is generated, based on the gain control value, from two or more received signals; and the change of each scalar control value is delayed based on the at least one processing delay associated with the generation of the corresponding demodulated signal; and the change of each scalar control value is delayed to coincide in time with a change in the corresponding demodulated signal resulting from an earlier detected change in the intensity value.

10. A method for processing one or more received signals, the method comprising:

generating, based on a gain control value, an output signal from the one or more received signals;

generating an intensity value in response to the output signal;

demodulating, for each received signal, the output signal into a corresponding demodulated signal having an amplitude;

scaling, for each demodulated signal, the amplitude of the corresponding demodulated signal based on a corresponding scalar control value; and generating and adaptively updating the gain control value and each scalar control value based on changes in the intensity value, wherein a change of at least one scalar control value is delayed based on at least one processing delay associated with generating the corresponding demodulated signal, wherein:

the output signal is generated, based on the gain control value, from three received signals comprising a COFDM signal and two TDM signals;

the output signal is independently demodulated by a COFDM demodulator and two TDM demodulators; and the change of each scalar control value is delayed based on the at least one processing delay associated with the generation of the corresponding demodulated signal.

11. The method of claim 10, wherein the change of each scalar control value is independently delayed to take into account any differences in the processing delays associated with the generation of the three demodulated signals.

12. A method for processing one or more received signals, the method comprising:
   generating, based on a gain control value, an output signal from the one or more received signals;
   generating an intensity value in response to the output signal;
   demodulating, for each received signal, the output signal into a corresponding demodulated signal having an amplitude;
   scaling, for each demodulated signal, the amplitude of the corresponding demodulated signal based on a corresponding scalar control value; and
   generating and adaptively updating the gain control value and each scalar control value based on changes in the intensity value, wherein a change of at least one scalar control value is delayed based on at least one processing delay associated with generating the corresponding demodulated signal, wherein:
      the output signal is generated, based on the gain control value, from two or more received signals; and
      the change of each scalar control value is delayed based on the at least one processing delay associated with the generation of the corresponding demodulated signal, wherein:
         the change of each scalar control value is independently delayed to take into account any differences in the processing delays associated with the generation of the two or more demodulated signals; and
         the change of each scalar control value is delayed to coincide in time with a change in the corresponding demodulated signal resulting from an earlier detected change in the intensity value.

13. A method for processing one or more received signals, the method comprising:
   generating, based on a gain control value, an output signal from the one or more received signals;
   generating an intensity value in response to the output signal;
   demodulating, for each received signal, the output signal into a corresponding demodulated signal having an amplitude;
   scaling, for each demodulated signal, the amplitude of the corresponding demodulated signal based on a corresponding scalar control value; and
   generating and adaptively updating the gain control value and each scalar control value based on changes in the intensity value, wherein a change of at least one scalar control value is delayed based on at least one processing delay associated with generating the corresponding demodulated signal, wherein the change of the at least one scalar control value is delayed to coincide in time with a change in the corresponding demodulated signal resulting from an earlier detected change in the intensity value.

14. A method for processing one or more received signals, the method comprising:
   generating, based on a gain control value, an output signal from the one or more received signals;
   generating an intensity value in response to the output signal;
   demodulating, for each received signal, the output signal into a corresponding demodulated signal having an amplitude;
   scaling, for each demodulated signal, the amplitude of the corresponding demodulated signal based on a corresponding scalar control value; and
   generating and adaptively updating the gain control value and each scalar control value based on changes in the intensity value, wherein a change of at least one scalar control value is delayed based on at least one processing delay associated with generating the corresponding demodulated signal, wherein a change in gain of each scalar is controlled to be substantially equal and opposite to an earlier change in gain of the gain section, such that amplitude scaling of each demodulated signal at least partially compensates for changes in gain in generating the output signal.

15. A method for processing one or more received signals, the method comprising:
   generating, based on a gain control value, an output signal from the one or more received signals;
   generating an intensity value in response to the output signal;
   demodulating, for each received signal, the output signal into a corresponding demodulated signal having an amplitude;
   scaling, for each demodulated signal, the amplitude of the corresponding demodulated signal based on a corresponding scalar control value; and
   generating and adaptively updating the gain control value and each scalar control value based on changes in the intensity value, wherein a change of at least one scalar control value is delayed based on at least one processing delay associated with generating the corresponding demodulated signal, further comprising the step of further scaling each scaled, demodulated signal based on a corresponding secondary scalar control value generated based on the further scaled, demodulated signal.

16. The method of claim 15, further comprising the step of digitizing the output signal for generating the intensity value and for each demodulation of the output signal.

17. Apparatus for processing one or more received signals, the apparatus comprising:
   means for generating, based on a gain control value, an output signal from the one or more received signals;
   means for generating an intensity value in response to the output signal;
   means for demodulating, for each received signal, the output signal into a corresponding demodulated signal having an amplitude;
   means for scaling, for each demodulated signal, the amplitude of the corresponding demodulated signal based on a corresponding scalar control value; and
   means for generating and adaptively updating the gain control value and each scalar control value based on changes in the intensity value, wherein a change of at least one scalar control value is delayed based on at least one processing delay associated with generating the corresponding demodulated signal, wherein:
      the apparatus is adapted to process three received signals comprising a COFDM signal and two TDM signals; and
      the apparatus comprises means for demodulating the COFDM signal, means for demodulating the two TDM signals, and means for scaling the three received signals; and
      the means for generating and adaptively updating the gain control value and each scalar control value is adapted to delay the change of each scalar control value based on the at least one processing delay associated with the generation of the corresponding demodulated signal.

18. Apparatus for processing one or more received signals, the apparatus comprising:
    means for generating, based on a gain control value, an output signal from the one or more received signals;
    means for generating an intensity value in response to the output signal;
    means for demodulating, for each received signal, the output signal into a corresponding demodulated signal having an amplitude;
    means for scaling, for each demodulated signal, the amplitude of the corresponding demodulated signal based on a corresponding scalar control value; and
    means for generating and adaptively updating the gain control value and each scalar control value based on changes in the intensity value, wherein a change of at least one scalar control value is delayed based on at least one processing delay associated with generating the corresponding demodulated signal, wherein:

the apparatus is adapted to receive two or more received signals;

the apparatus comprises means for demodulating the two or more received signals and means for scaling the two or more received signals; and the means for generating and adaptively updating the gain control value and each scalar control value is adapted to delay the change of each scalar control value based on the at least one processing delay associated with the generation of the corresponding demodulated signal, wherein the means for generating and adaptively updating the gain control value and each scalar control value, responsive to the means for demodulating, is adapted to independently delay the change of each scalar control value in accordance with any differences in the processing delays by the means for demodulating.

* * * * *